United States Patent [19]
Luo et al.

[11] Patent Number: 6,091,627
[45] Date of Patent: Jul. 18, 2000

[54] MESSAGE BOX MEMORY CELL FOR TWO-SIDE ASYNCHRONOUS ACCESS

[75] Inventors: Wenzhe Luo, Allentown, Pa.; Brian J. Petryna, Lebanon, N.J.

[73] Assignee: Lucent Technologies, Inc., Murray Hill, N.J.

[21] Appl. No.: 09/154,276

[22] Filed: Sep. 16, 1998

[51] Int. Cl.[7] .................................................. G11C 7/00
[52] U.S. Cl. ..................................... 365/154; 365/189.04
[58] Field of Search .............................. 365/189.04, 203, 365/230.05, 1.54

[56] References Cited

U.S. PATENT DOCUMENTS

| | | | |
|---|---|---|---|
| 5,734,613 | 3/1998 | Gibson | 365/189.04 |
| 5,742,557 | 4/1998 | Gibbons et al. | 365/230.05 |
| 5,751,638 | 5/1998 | Mick et al. | 365/189.04 |
| 5,773,892 | 6/1998 | Morikawa et al. | 257/758 |
| 5,883,827 | 3/1999 | Morgan | 365/10 |

Primary Examiner—David Nelms
Assistant Examiner—M. Tran
Attorney, Agent, or Firm—Dickstein Shapiro Morin & Oshinsky, LLP

[57] ABSTRACT

A new memory cell design having differential and dedicated read and write ports is disclosed. The memory cell utilizes separate write and read bit lines. The read bit lines are pre-charged to a first level. A grounding transistor is provided between the circuitry containing the cell's contents and the read bit lines such that the contents of the cell are isolated from the read bit lines. The grounding transistor is activated and deactivated by the data within the cell. The activation and deactivation of the grounding transistor causes the pre-charged bit lines to be pulled-down to a second level or to remain at the first level to accurately reflect the contents of the cell. Since the circuitry containing the contents of the cell is isolated from the read bit lines, a read operation on the cell will not interfere with an in progress write operation and thus, destruction of the cell's contents is prevented. In addition, the isolation prevents bit line coupling.

41 Claims, 3 Drawing Sheets

MESSAGE BOX MEMORY CELL FOR TWO-SIDE ASYNCHRONOUS ACCESS

BACKGROUND OF THE INVENTION

1. Field of the Invention

This invention relates generally to the field of semiconductor memory devices and, more particularly, to a message box memory cell for two-side asynchronous access.

2. Description of the Related Art

Sometimes, two devices wish to communicate with each other. These devices may be individual processors or a processor system having two or more processor cores. Typically, the devices are operating at different rates and thus, work asynchronously with respect to each other. One known technique for allowing data interchange is to provide a message box between the asynchronous devices.

The message box can be a multi-port SRAM (static random access memory) or a register created out of multiple SRAM cells. A typical SRAM array is illustrated in FIG. 1. The SRAM consists of a matrix of storage bits with bit capacity $2^N \times 2^M$ bits arranged in an array 200 with $2^M$ columns (bit lines) and $2^N$ rows (word lines). To read data stored in the array 200, a row address is input and decoded by row decoder 202 to select one of the rows or word lines. All of the cells along this word line are activated. A column decoder 204 then addresses one bit out of the $2^M$ bits that have been activated and routes the data that is stored in that bit to a sense amplifier (not shown) and then out of the array 200. Data in and Data out are controlled by the Read/Write Control circuit 206.

A conventional SRAM cell consists of a basic bistable flip-flop circuit which needs only a DC current applied to retain its memory. A conventional SRAM cell 10 is illustrated in FIG. 2. The cell 10 includes two inverters 14, 16 and two control transistors 18, 20. The output of the second inverter 16 is connected to the input of the first inverter 14 and a first node A. The output of the first inverter 14 is connected to the input of the second inverter 16 and a second node B. The two inverters 14, 16, as connected, define a flip-flop 12. The first transistor 18 is connected between the first node A and a first bit line BL. The second transistor 20 is connected between the second node B and a second bit line BLN. A word line WL is connected to the gate terminal of the two transistors 18, 20. Data is stored with either a high potential at node A and a low potential at node B, or a low potential at node A and a high potential at node B. This means that two stable states are available which are respectively defined as a logic 1 or a logic 0.

The logic state of the SRAM cell 10 is read by sensing the current on the bit line pair comprised of bit lines BL and BLN and/or the differential voltage developed thereon. When a word line WL is selected, cell 10 is activated by turning on the two transistors 18, 20. If the activated SRAM cell 10 is in a logic 1 state, node A is high and node B is low. If the activated SRAM cell 10 is in a logic 0 state, node A is low and node B is high. Similarly, data is stored into the cell 10 by activating the WL and placing the appropriate current or differential voltage on the two bit lines BL, BLN. In the conventional SRAM cell 10, read and write operations are performed in an alternate manner since the cell 10 uses only one pair of bit lines BL, BLN. This is not suitable for a mailbox used for communications between asynchronous devices.

FIG. 3 illustrates a proposed multi-port 1write-1read (1W-1R) SRAM cell 30 to be used in a mailbox. The cell 30 includes two inverters 34, 36 and four control transistors 38, 40, 42, 44. The output of the second inverter 36 is connected to the input of the first inverter 34 and first and second nodes A1, A2. The output of the first inverter 34 is connected to the input of the second inverter 36 and third and fourth nodes B1, B2. The two inverters 34, 36, as connected, define a flip-flop 32.

The first transistor 38 is connected between the first node A1 and a first write bit line WBL. The second transistor 40 is connected between the third node B1 and a second write bit line WBLN. A write word line WWL is connected to the gate terminal of the first and second transistors 38, 40. The third transistor 42 is connected between the second node A2 and a first read bit line RBL. The fourth transistor 44 is connected between the fourth node B2 and a second read bit line RBLN. A read word line RWL is connected to the gate terminal of the third and fourth transistors 42, 44. Data is stored with either a high potential at nodes A1, A2 and a low potential at nodes B1, B2 or a low potential at nodes A1, A2 and a high potential at nodes B1, B2. This means that two stable states are available which are respectively defined as a logic 1 or a logic 0.

The SRAM cell 30 is designed such that there is one read port controlled by a read word line RWL and one write port controlled by a write word line WWL. The logic state of the SRAM cell 30 is read by sensing the current on the read bit line pair comprised of read bit lines RBL and RBLN and/or the differential voltage developed thereon. When a read word line RWL is selected, cell 30 is activated by turning on the transistors 42, 44. If the activated SRAM cell 30 is in a logic 1 state, node A2 is high and node B2 is low. If the activated SRAM cell 30 is in a logic 0 state, node A2 is low and node B2 is high. Similarly, data is stored into the cell 30 by activating the write word line WWL and placing the appropriate current or differential voltage on the two word bit lines WBL, WBLN. Although the SRAM cell 30 has individual read and write bit lines, the cell 30 is not suitable for a mailbox used for communications between asynchronous devices because simultaneous read and write operations could occur which would lead to corruption of the cells contents.

In addition, the cell 30 (and the cell 10 of FIG. 2) is subject to capacitive coupling between the bit lines when incorporated into a memory array. Capacitive coupling leads to coupling noise which could reverse the potential relationship between the differential bit lines. Any circuitry utilizing this cell 30 would have to compensate for the coupling noise. One know solution is to delay the operation of the sense amplifiers which slows down the operation memory. This is undesirable.

FIG. 4 illustrates a proposed multi-port 1write-2read (1W-2R) SRAM cell 60 to be used as a mailbox. The cell 60 contains the same configuration as the cell 30 illustrated in FIG. 2 except that two read ports are created by using read bit lines RBL1, RBL2 that are not differential. The SRAM cell 60 is designed such that there are two read ports respectively controlled by first and second read word lines RWL1, RWL2 and one write port controlled by a write word line WWL. Data is stored into the cell 60 in the same manner as described for cell 30 (FIG. 2).

It must be noted that two read ports are not differential and that the logic state of the SRAM cell 60 is directly read from each read bit line RBL1, RBL2. The read operation is dependent upon the pull-up/pull-down strength of the cell 60. When the first read word line RWL1 is selected, cell 60 is activated by turning on the third transistor 42. The contents of the cell 60 will be placed on the first read bit line RBL1. When the second read word line RWL2 is selected, cell 60 is activated by turning on the fourth transistor 44. The contents of the cell 60 will be placed on the second read bit line RBL2.

Although the SRAM cell 60 has individual read and write bit lines for one device and an individual read line for a second device, the cell 60 is not suitable for a mailbox used for communications between asynchronous devices because simultaneous read and write operations could occur which would lead to corruption of the cells contents. In addition, since the read bit lines are not differential, the operation of the cell 60 is very slow.

It is essential that any message box used between two or more devices to be able to handle a read and write operation that occurs at the same time without having its contents corrupted. This is of particular importance when the two devices are operating asynchronously. As stated above, none of the cells 10, 30, 60 are capable of handling simultaneous reads and writes. In addition, bit line coupling may occur at any time during a read cycle and the operation of one device may disturb the operation of the other device particularly when one device has activated the word lines and the other device initiates a read. Accordingly, there is a desire and need for a memory cell suitable for a message box between asynchronous devices that will not have its contents destructed by simultaneous read and write operations. In addition, there is a desire and need for a memory cell suitable for a message box between asynchronous devices capable of overcoming bit line coupling.

SUMMARY OF THE INVENTION

The present invention provides a memory cell suitable for a message box between asynchronous devices that will not have its contents destructed by simultaneous read and write operations.

The present invention also provides a memory cell suitable for a message box between asynchronous devices capable of overcoming bit line coupling.

The above and other features and advantages of the invention are achieved by providing a new memory cell design having differential and dedicated read and write ports. The memory cell utilizes separate write and read bit lines. The read bit lines are pre-charged to a first level. A grounding transistor is provided between the circuitry containing the cell's contents and the read bit lines such that the contents of the cell are isolated from the read bit lines. The grounding transistor is activated and deactivated by the data within the cell. The activation and deactivation of the grounding transistor causes the pre-charged bit lines to be pulled-down to a second level or to remain at the first level to accurately reflect the contents of the cell. Since the circuitry containing the contents of the cell are isolated from the read bit lines, a read operation on the cell will not interfere with an in progress write operation and thus, destruction of the cell's contents is prevented. In addition, the isolation prevents bit line coupling.

BRIEF DESCRIPTION OF THE DRAWINGS

The foregoing and other advantages and features of the invention will become more apparent from the detailed description of the preferred embodiments of the invention given below with reference to the accompanying drawings in which.

DETAILED DESCRIPTION OF THE PREFERRED EMBODIMENTS

Figure 5:
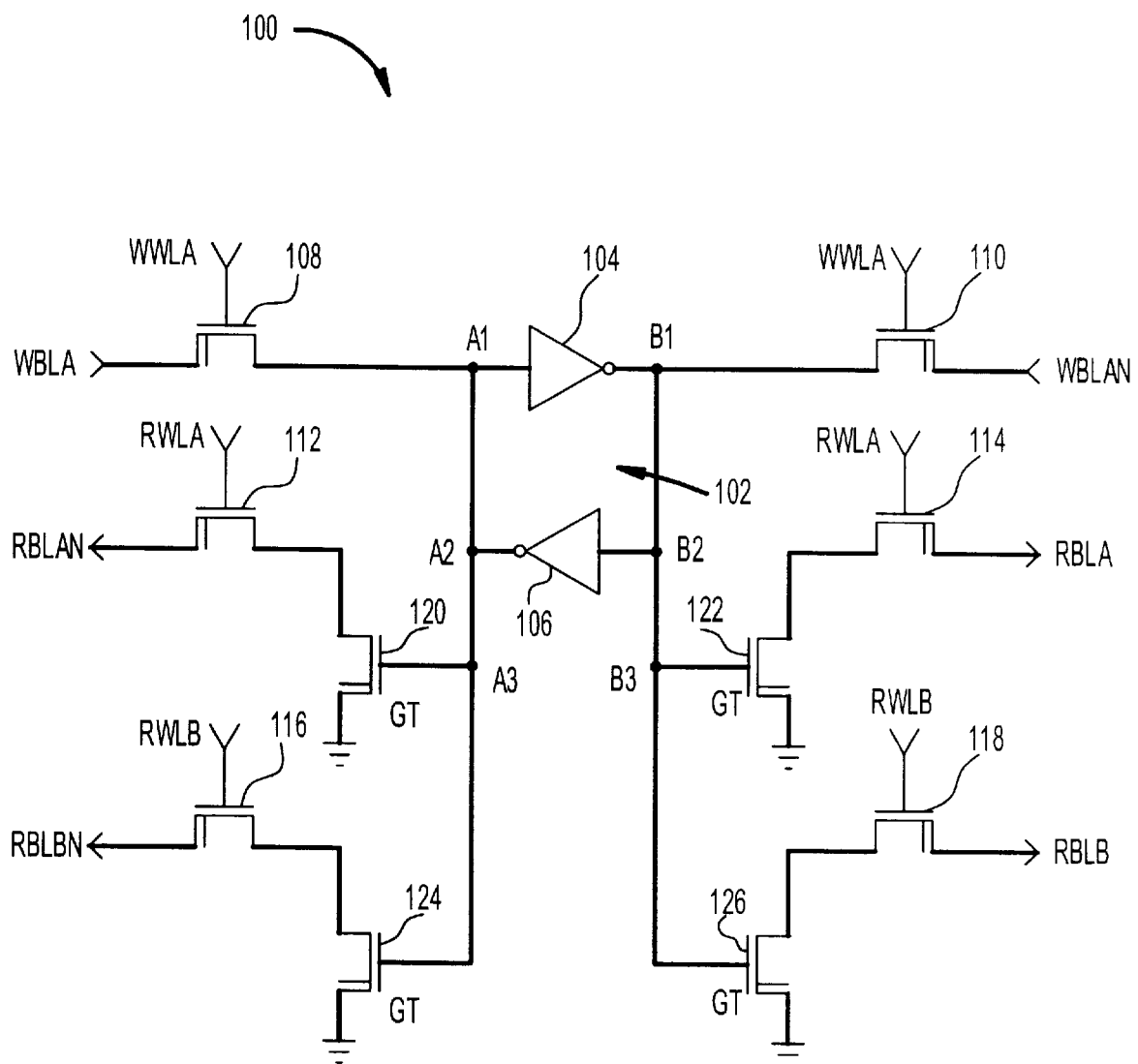
FIG. 5 illustrates a memory cell constructed in accordance with the preferred embodiment of the present invention.

FIG. 5 illustrates a memory cell 100 constructed in accordance with a preferred embodiment of the present invention. As will be described below, the cell 100 is configured as a 1write/read-1read (1WR/1R) SRAM cell 100. In the 1WR/1R SRAM cell 100, one device is capable of writing into and reading from the cell 100 while another device can only read information out of the cell 100. As will be discussed below, the memory cell 100 is well suited for use as a message box between two asynchronous devices. It must also be noted that the memory cell 100 constructed in accordance with the present invention can also be used in any application requiring multi-port, high-speed memory. If, for example, two or more devices needed to write information into the mailbox, then two such cells 100 would be used as a mailbox.

The cell 100 includes two inverters 104, 106, six control transistors 108, 110, 112, 114, 116, 118 and four grounding transistors 120, 122, 124, 126. The output of the second inverter 106 is connected to the input of the first inverter 104 and first, second and third nodes A1, A2, A3. The output of the first inverter 104 is connected to the input of the second inverter 106 and fourth, fifth and sixth nodes B1, B2, B3. The two inverters 104, 106, as connected, define a flip-flop 102.

The first control transistor 108 is connected between the first node A1 and a first write bit line WBLA. The second control transistor 110 is connected between the fourth node B1 and a second write bit line WBLAN. A write word line WWLA is connected to the gate terminal of the first and second control transistors 108, 110.

The third control transistor 112 is connected between a first read bit line RBLAN and the first grounding transistor 120. The fourth control transistor 114 is connected between a second read bit line RBLA and the second grounding transistor 122. A first read word line RWLA is connected to the gate terminal of the third and fourth control transistors 112, 114. The fifth control transistor 116 is connected between a third read bit line RBLBN and the third grounding transistor 124. The sixth control transistor 118 is connected between a fourth read bit line RBLB and the fourth grounding transistor 126. A second read word line RWLB is connected to the gate terminal of the fifth and sixth control transistors 116, 118. Data is stored with either a high potential at nodes A1, A2, A3 and a low potential at nodes B1, B2, B3 or a low potential at nodes A1, A2, A3 and a high potential at nodes B1, B2, B3. This means that two stable states are available which are defined as a logic 1 or a logic 0.

The first grounding transistor 120 has its gate terminal connected to the third node A3 and is connected between a ground potential and the third control transistor 112. The second grounding transistor 122 has its gate terminal connected to the sixth node B3 and is connected between a ground potential and the fourth control transistor 114. The third grounding transistor 124 has its gate terminal connected to the third node A3 and is connected between a ground potential and the fifth control transistor 116. The fourth grounding transistor 124 has its gate terminal connected to the sixth node B3 and is connected between a ground potential and the sixth control transistor 118.

The SRAM cell 100 is designed such that there is one read port controlled by the first read word line RWLA, a second read port controlled by the second read word line RWLB and one write port controlled by a write word line WWLA. Preferably, when the SRAM cell 100 is used as a mailbox between two asynchronous, the first read word line RWLA and the write word line WWLA are accessible by a first device while the second read word line RWLB is accessible by a second device. Likewise, the first and second write bit lines WBLA, WBLAN and the first and second read bit lines RBLAN, RBLA are accessible by the first device while the third and fourth read bit lines RBLBN, RBLB are accessible by the second device.

In operation, data is stored into the cell 100 by activating the write word line WWLA which turns on the first and second control transistors 108, 110 and placing the appropriate current or differential voltage on the two word bit lines WBLA, WBLAN such that data is stored within the flip-flop 102.

A read operation is performed as follows. All of the read bit lines RBLAN, RBLA, RBLBN, RBLB are pre-charged to a high level. The high level represents potential difference associated with a logic 1. The grounding transistors 120, 122, 124, 126 are either in an activated or deactivated state depending upon the potential at the third and sixth nodes A3, B3. As stated above, there are two possible states for the third and sixth nodes A3, B3. That is, either node A3 is high and node B3 is low or node A3 is low and node B3 is high. Therefore, either the first and third grounding transistors 120, 124 will be activated while the second and fourth grounding transistors 122, 126 are deactivated or the first and third grounding transistors 120, 124 will be deactivated while the second and fourth grounding transistors 122, 126 are activated.

In the activated state, the grounding transistors 120, 122, 124, 126 are capable of pulling down their respective bit lines RBLAN, RBLA, RBLBN, RBLB when the first and second read word lines RWLA, RWLB are activated. When the bit lines RBLAN, RBLA, RBLBN, RBLB are pulled down, they will be at a ground potential. In the deactivated state, the grounding transistors 120, 122, 124, 126 are not capable of pulling down their respective bit lines RBLAN, RBLA, RBLBN, RBLB when the first and second read word lines RWLA, RWLB are activated and thus, the respective bit lines RBLAN, RBLA, RBLBN, RBLB would remain at the pre-charged level.

If, for example, the third node A3 is high and the sixth node B3 is low (e.g., representing a logic 1 state) when the first and second read word lines RWLA, RWLB are activated, the first and third grounding transistors 120, 124 will pull down the first and third read bit lines RBLAN, RBLBN. The second and fourth grounding transistors 122, 126 are off and thus, the second and fourth read bit lines RBLA, RBLB will remain at the pre-charged level. Thus, the first read bit line pair consisting of the first and second read bit lines RBLAN, RBLA would have a potential differential equal to a logic 1 state when sensed by appropriate circuitry. Likewise, the second read bit line pair consisting of the third and fourth read bit lines RBLBN, RBLB would also have a potential differential equal to a logic 1 state when sensed by appropriate circuitry.

If, for example, the third node A3 is low and the sixth node B3 is high (e.g., representing a logic 0 state) when the first and second read word lines RWLA, RWLB are activated, the second and fourth grounding transistors 122, 126 will pull down the second and fourth read bit lines RBLA, RBLB. The first and third grounding transistors 120, 124 are off and thus, the first and third read bit lines RBLAN, RBLBN will remain at the pre-charged level. Thus, the first read bit line pair consisting of the first and second read bit lines RBLAN, RBLA would have a potential differential equal to a logic 0 state when sensed by appropriate circuitry. Likewise, the second read bit line pair consisting of the third and fourth read bit lines RBLBN, RBLB would also have a potential differential equal to a logic 0 state when sensed by appropriate circuitry.

The use of grounding transistors 120, 122, 124, 126 within the SRAM cell 100 of the present invention improves the robustness of the cell 100 since the read bit lines RBLAN, RBLA, RBLBN, RBLB are isolated from the flip-flop 102. The isolation prevents a read operation from corrupting the contents of the flip-flop 102 when the read is initiated while a write operation is already in progress. This is essential when the SRAM cell 100 is being used in a memory array or mailbox that is being utilized as a communication device between asynchronous devices. In addition, the grounding transistors 120, 122, 124, 126 allow the cell 100 to use differential bit lines which improves the speed of a memory circuit incorporating the cell 100.

Figure 2:
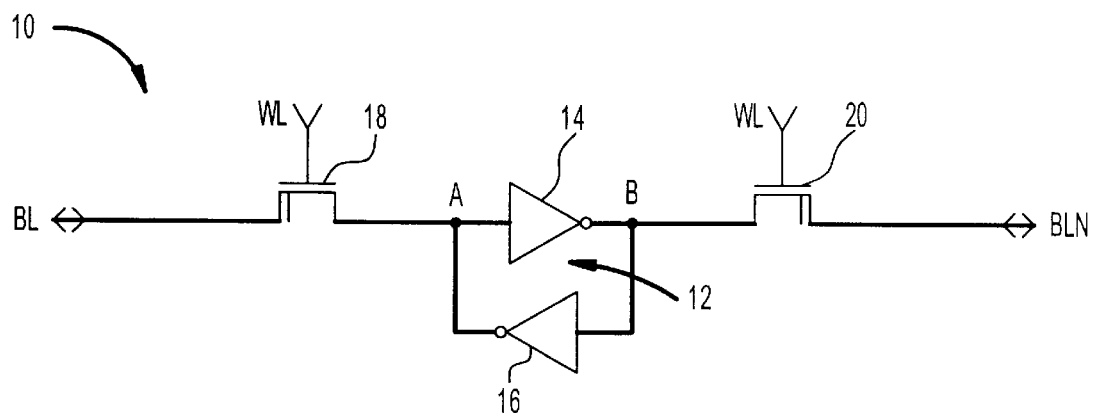
FIG. 2 illustrates a conventional SRAM cell.
Figure 3:
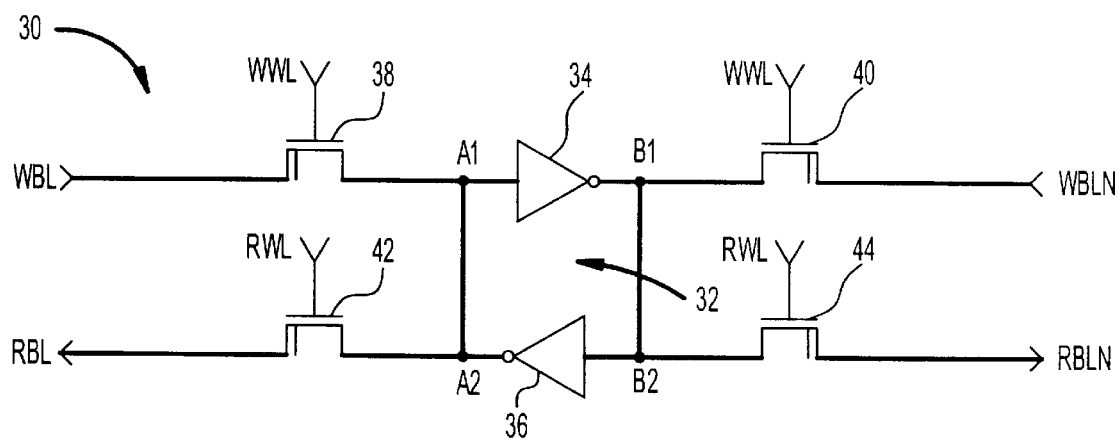
FIG. 3 illustrates a 1write-1read SRAM cell.
Figure 4:
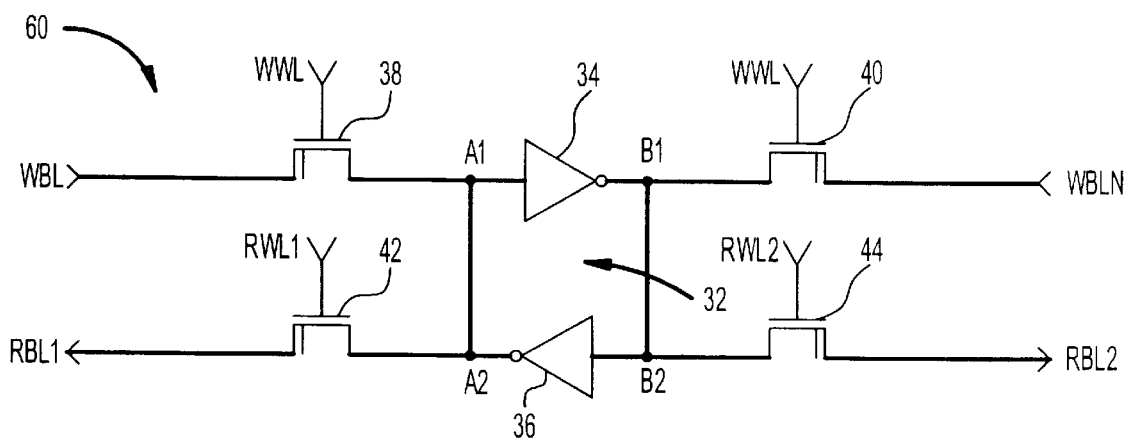
FIG. 4 illustrates a 1write-2read SRAM cell.

It must be noted that the grounding transistors 120, 122, 124, 126 are driving the read bit lines RBLAN, RBLA, RBLBN, RBLB as opposed to the flip-flop 12, 32, 62 of the conventional SRAM cells 10, 30, 60 (FIGS. 2–4). These flip-flops 12, 32, 62 are constrained in size and thus, the driving strength of the cells 10, 32, 62 are not easily adjustable. With the configuration of the present invention, the grounding transistors 120, 122, 124, 126 can be made larger for faster and more reliable reads without being effected by noise attributable to the flip-flop 102.

Figure 1:
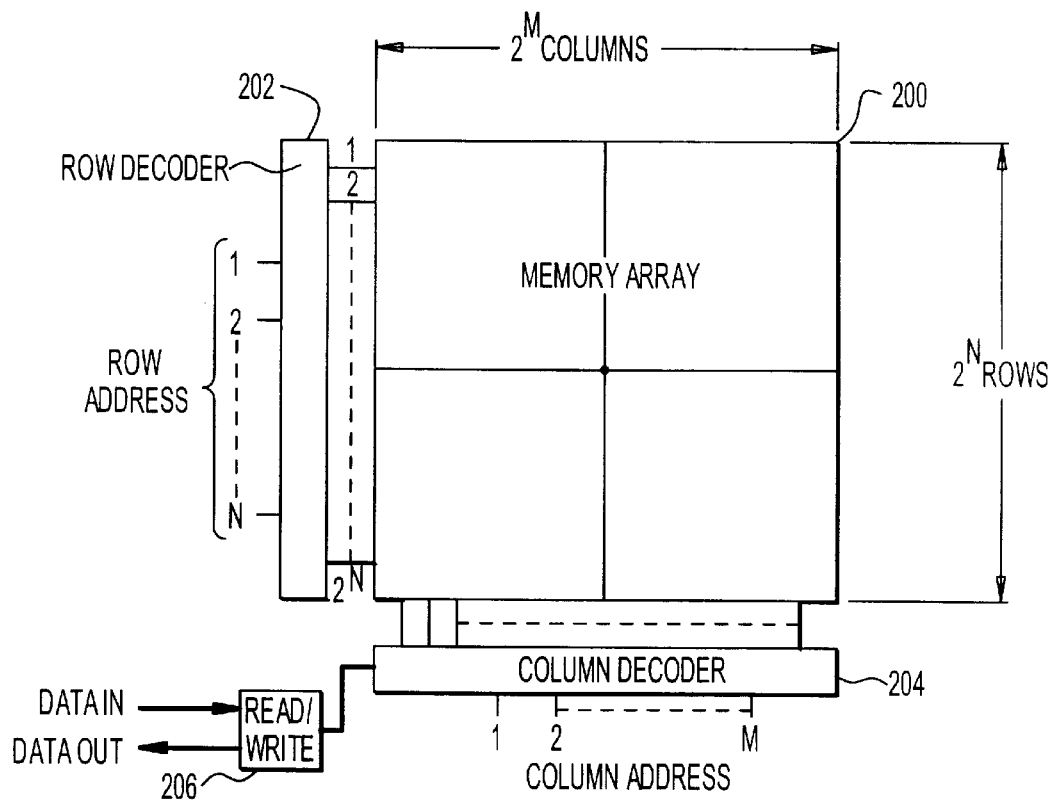
FIG. 1 illustrates in block diagram form a convention static random access memory (SRAM) circuit.
Figure 6:
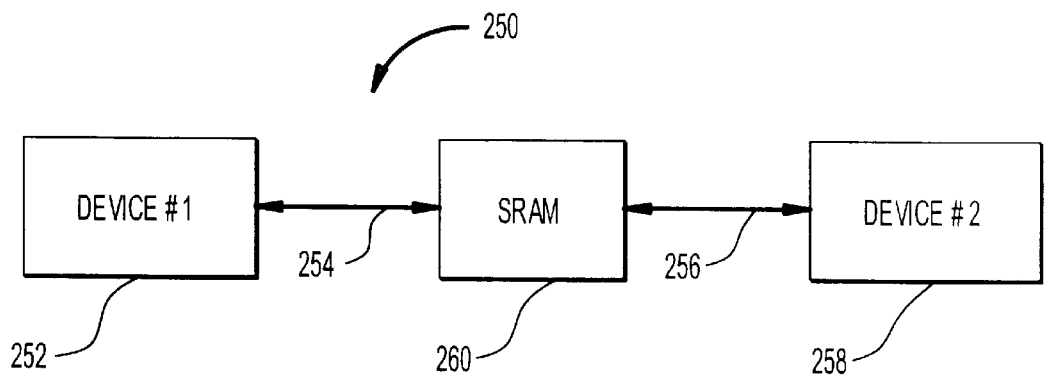
FIG. 6 is a block diagram of a computer system utilizing a memory array constructed in accordance with the present invention.

It must be noted that the present invention can be used as memory in a computer system. FIG. 6 illustrates a computer system 250 including a SRAM circuit 260 comprised of SRAM cells 100 (FIG. 5) constructed in accordance with the present invention. The computer system 250 also includes two devices 252, 258 that communicate with the SRAM circuit 258 over respective buses 254, 256. In this system 250, the SRAM circuit 258 will serve as a mailbox between the two devices 252, 258. It must be noted that the two devices 252, 258 can be any devices which need to share data, such as processors, processor cores, or any other device requiring data input or output.

It must be noted that the present invention can be use for three-side access without any further modifications to the cell 100. For example, the two read ports and the one write port can each be associated with a respective device. In addition, present invention can use write and read bit lines that are not differential. If non-differential read or word bit lines are used, then the read and write ports only need to be connected to one of the nodes A1, A2, A3, B1, B2, B3 and not both. This also allows for the possibility that six individual devices can share one cell 100.

While the invention has been described in detail in connection with the preferred embodiments known at the time, it should be readily understood that the invention is not limited to such disclosed embodiments. The SRAM cell 100 illustrated in FIG. 5 is only an exemplary configuration of the present invention and that many changes and modifications can be made to produce an equivalent SRAM cell 100. The invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A memory circuit comprising:
   a storage circuit having a first node and a second node, each of said nodes having a respective potential representative of data stored in said storage circuit;
   a data write circuit connected to said first and second node;
   at least one data read circuit; and
   at least one isolation circuit associated with and connected between a respective data read circuit and said first and second nodes, each of said at least one isolation circuit being controlled by the respective potentials of said first and second nodes, each of said at least one isolation circuit driving its associated data read circuit with signals corresponding to the data stored within said storage circuit, wherein said isolation circuit prevents said data read circuit from corrupting the data stored within said storage circuit.

2. The memory circuit of claim 1 wherein each of said data read circuit comprises:
   a word line;
   a pair of bit lines, each of said bit lines being pre-charged to a first potential; and
   a pair of control elements, each of said control elements being connected to said word line, one of said control elements being connected between said first node and one of said bit lines, and a second one of said control elements being connected between said second node and a second one of said bit lines, wherein said isolation circuit pulls down the potential of one of said bit lines such that said pair of bit lines correspond to the data stored within said storage circuit when said word line is activated.

3. The memory circuit of claim 2 wherein each of said pair of control elements are transistors.

4. The memory circuit of claim 2 wherein each of said at least one isolation circuit comprises a pair of switching elements, each of said pair of switching elements being associated with and connected between one of said pair of control elements and a second potential, one of said pair of switching elements being connected to and controlled by said first node and a second one of said pair of switching elements being connected to and controlled by said second node.

5. The memory circuit of claim 4 wherein said switching elements are transistors.

6. The memory circuit of claim 1 wherein a number of said at least one data read circuit is two.

7. The memory circuit of claim 1 wherein said storage circuit is a flip-flop.

8. An integrated circuit for providing a communication mailbox, said circuit comprising:
   a memory circuit, said memory circuit comprising:
   a storage circuit having a first node and a second node, each of said nodes having a respective potential representative of data stored in said storage circuit;
   a data write circuit connected to said first and second node;
   at least one data read circuit; and
   at least one isolation circuit associated with and connected between a respective data read circuit and said first and second nodes, each of said at least one isolation circuit being controlled by the respective potentials of said first and second nodes, each of said at least one isolation circuit driving its associated data read circuit with signals corresponding to the data stored within said storage circuit, wherein said isolation circuit prevents said data read circuit from corrupting the data stored within said storage circuit.

9. The circuit of claim 8 wherein each of said data read circuit comprises:
   a word line;
   a pair of bit lines, each of said bit lines being pre-charged to a first potential; and
   a pair of control elements, each of said control elements being connected to said word line, one of said control elements being connected between said first node and one of said bit lines, and a second one of said control elements being connected between said second node and a second one of said bit lines, wherein said isolation circuit pulls down the potential of one of said bit lines such that said pair of bit lines correspond to the data stored within said storage circuit when said word line is activated.

10. The circuit of claim 9 wherein each of said pair of control elements are transistors.

11. The circuit of claim 9 wherein each of said at least one isolation circuit comprises a pair of switching elements, each of said pair of switching elements being associated with and connected between one of said pair of control elements and a second potential, one of said pair of switching elements being connected to and controlled by said first node and a second one of said pair of switching elements being connected to and controlled by said second node.

12. The circuit of claim 11 wherein said switching elements are transistors.

13. The circuit of claim 8 wherein a number of said at least one data read circuit is two.

14. The circuit of claim 8 wherein said storage circuit is a flip-flop.

15. A computer system comprising:
    a first processor; and
    a memory circuit connected to said first processor, said memory circuit comprising:
    a storage circuit having a first node and a second node, each of said nodes having a respective potential representative of data stored in said storage circuit;
    a data write circuit connected to said first and second node;
    at least one data read circuit; and
    at least one isolation circuit associated with and connected between a respective data read circuit and said first and second nodes, each of said at least one isolation circuit being controlled by the respective potentials of said first and second nodes, each of said at least one isolation circuit driving its associated data read circuit with signals corresponding to the data stored within said storage circuit, wherein said isolation circuit prevents said data read circuit from corrupting the data stored within said storage circuit.

16. The system of claim 15 wherein each of said data read circuit comprises:
    a word line;
    a pair of bit lines, each of said bit lines being pre-charged to a first potential; and a pair of control elements, each of said control elements being connected to said word line, one of said control elements being connected between said first node and one of said bit lines, and a second one of said control elements being connected between said second node and a second one of said bit lines, wherein said isolation circuit pulls down the potential of one of said bit lines such that said pair of bit lines correspond to the data stored within said storage circuit when said word line is activated.

17. The system of claim 16 wherein each of said pair of control elements are transistors.

18. The system of claim 16 wherein each of said at least one isolation circuit comprises a pair of switching elements, each of said pair of switching elements being associated with and connected between one of said pair of control elements and a second potential, one of said pair of switching elements being connected to and controlled by said first node and a second one of said pair of switching elements being connected to and controlled by said second node.

19. The system of claim 18 wherein said switching elements are transistors.

20. The system of claim 15 wherein a number of said at least one data read circuit is two.

21. The system of claim 15 wherein said storage circuit is a flip-flop.

22. The system of claim 15 further comprising a second processor connected to said memory circuit, said memory circuit allowing said first processor to write into and read from said storage circuit and said memory circuit allowing said second processor to read from said storage device.

23. The system of claim 15 further comprising a second processor connected to said memory circuit, said memory circuit allowing said first processor to read from said storage circuit and said memory circuit allowing said second processor to write into and read from said storage device.

24. A memory circuit comprising:
  a storage circuit containing data having an associated potential;
  a data write circuit connected to storage circuit;
  at least one data read circuit; and
  at least one isolation circuit associated with and connected between a respective data read circuit and said storage circuit, each of said at least one isolation circuit being controlled by the potentials of said data stored within said storage circuit, each of said at least one isolation circuit driving its associated data read circuit with signals corresponding to the data stored within said storage circuit, wherein said isolation circuit prevents said data read circuit from corrupting the data stored within said storage circuit.

25. The memory circuit of claim 26 wherein each of said data read circuit comprises:
  a word line;
  a bit lines, said bit line being pre-charged to a first potential; and
  a control element, said control element being connected to said word line, said control elements being connected between said storage circuit and said bit line, wherein said isolation circuit ensures that said bit line has a potential corresponding to the data stored within said storage circuit.

26. The memory circuit of claim 25 wherein control element is a transistor.

27. The memory circuit of claim 25 wherein said at least one isolation circuit comprises a switching element, said switching element being associated with and connected to a control element and a second potential, said switching element being connected to and controlled by said storage circuit.

28. The memory circuit of claim 27 wherein said switching element is a transistor.

29. The memory circuit of claim 24 wherein a number of said at least one data read circuit is two.

30. The memory circuit of claim 24 wherein said storage circuit is a flip-flop.

31. A memory circuit comprising:
  a storage circuit having a first node and a second node, each of said nodes having a respective potential representative of data stored in said storage circuit;
  a write word line;
  two write control transistors, one of said write control transistors being connected between said first node and a first write bit line and a second one of said write control transistors being connected between said second node and a second write bit line, each of said write control transistors being activated by said write word line;
  a first read word line;
  a first pair of read bit lines, each of said first pair of read bit lines being pre-charged to a first potential;
  a first pair of read control transistors, one of said first pair of read control transistors being connected to one of said first pair of read bit lines, a second one of said pair of first read control transistors being connected to a second one of said first pair of read bit lines, each of said first pair of read control transistors being activated by said first read word line;
  a second read word line;
  a second pair of read bit lines, each of said second pair of read bit lines being pre-charged to the first potential;
  a second pair of read control transistors, one of said second pair of read control transistors being connected to one of said second pair of read bit lines, a second one of said pair of second read control transistors being connected to a second one of said second pair of read bit lines, each of said second pair of read control transistors being activated by said second read word line; and
  two pairs of isolation transistors, each of said isolation transistors being connected between and associated with a respective read control transistor and a second potential, two of said isolation transistors being connected to said first node and two other isolation transistors being connected to said second node, each of said isolation transistors being controlled by the respective potentials of said first and second nodes, each of said isolation transistors driving its associated read control transistor with signals corresponding to the data stored within said storage circuit.

32. A method of reading data from a memory circuit, said method comprising:
  providing an isolation circuit between a data read circuit and a storage circuit of the memory circuit;
  applying the data stored within the storage device to the isolation device to drive the data read circuit with signals representing the data stored within the storage circuit; and
  activating the data read circuit to receive the signals from the isolation circuit, wherein said step of providing an isolation circuit prevents the corruption of the data stored within the storage element.

33. The method of claim 32 further comprising the step of pre-charging bit line pairs of the data read circuit to a first potential, wherein said isolation circuit pulls-down the potential of one of the bit lines of each of said bit line pairs so that each bit line pair has a potential corresponding to the data stored within the storage element.

34. A method of interchanging data between two devices, said devices being connect to a shared device, the method comprising the steps of:
- having a first device write data into a storage device of said memory circuit;
- providing a first isolation circuit between a first data read circuit and a storage circuit of the memory circuit;
- applying the data stored within the storage device to the first isolation device to drive the first data read circuit with signals representing the data stored within the storage circuit; and
- having a second device activate the first data read circuit to receive the signals from the first isolation circuit, wherein said step of providing a first isolation circuit prevents the corruption of the data stored within the storage element.

35. The method of claim 34 further comprising the step of pre-charging bit line pairs of the data read circuit to a first potential, wherein said isolation circuit pulls-down the potential of one of the bit lines of each of said bit line pairs so that each bit line pair has a potential corresponding to the data stored within the storage element.

36. The method of claim 34 further comprising the steps of:
- providing a second isolation circuit between a second data read circuit and the storage circuit of the memory circuit;
- applying the data stored within the storage device to the second isolation device to drive the second data read circuit with signals representing the data stored within the storage circuit; and
- having the first device activate the second data read circuit to receive the signals from the second isolation circuit, wherein said step of providing a second isolation circuit prevents the corruption of the data stored within the storage element.

37. A memory circuit comprising:
- a storage circuit having a first node and a second node, each of said nodes having a respective potential representative of data stored in said storage circuit;
- a data write circuit connected to said first and second node;
- first and second data read circuits; and
- at least one isolation circuit associated with and connected between a respective data read circuit and said first and second nodes, each of said at least one isolation circuit being controlled by the respective potentials of said first and second nodes, each of said at least one isolation circuit driving its associated data read circuit with signals corresponding to the data stored within said storage circuit.

38. A computer system comprising:
- a first processor; and
- a memory circuit connected to said first processor, said memory circuit comprising:
  - a storage circuit having a first node and a second node, each of said nodes having a respective potential representative of data stored in said storage circuit;
  - a data write circuit connected to said first and second node;
  - first and second data read circuits; and
  - at least one isolation circuit associated with and connected between a respective data read circuit and said first and second nodes, each of said at least one isolation circuit being controlled by the respective potentials of said first and second nodes, each of said at least one isolation circuit driving its associated data read circuit with signals corresponding to the data stored within said storage circuit.

39. A computer system comprising:
- a first processor;
- a memory circuit connected to said first processor, said memory circuit comprising:
  - a storage circuit having a first node and a second node, each of said nodes having a respective potential representative of data stored in said storage circuit,
  - a data write circuit connected to said first and second node,
  - at least one data read circuit, and
  - at least one isolation circuit associated with and connected between a respective data read circuit and said first and second nodes, each of said at least one isolation circuit being controlled by the respective potentials of said first and second nodes, each of said at least one isolation circuit driving its associated data read circuit with signals corresponding to the data stored within said storage circuit; and
- a second processor connected to said memory circuit, said memory circuit allowing said first processor to write into and read from said storage circuit and said memory circuit allowing said second processor to read from said storage device.

40. A computer system comprising:
- a first processor;
- a memory circuit connected to said first processor, said memory circuit comprising:
  - a storage circuit having a first node and a second node, each of said nodes having a respective potential representative of data stored in said storage circuit,
  - a data write circuit connected to said first and second node,
  - at least one data read circuit, and
  - at least one isolation circuit associated with and connected between a respective data read circuit and said first and second nodes, each of said at least one isolation circuit being controlled by the respective potentials of said first and second nodes, each of said at least one isolation circuit driving its associated data read circuit with signals corresponding to the data stored within said storage circuit; and
- a second processor connected to said memory circuit, said memory circuit allowing said first processor to read from said storage circuit and said memory circuit allowing said second processor to write into and read from said storage device.

41. A memory circuit comprising:
- a storage circuit containing data having an associated potential;
- a data write circuit connected to storage circuit;
- first and second data read circuits; and
- at least one isolation circuit associated with and connected between a respective data read circuit and said storage circuit, each of said at least one isolation circuit being controlled by the potentials of said data stored within said storage circuit, each of said at least one isolation circuit driving its associated data read circuit with signals corresponding to the data stored within said storage circuit.

* * * * *